(12) United States Patent
Ka et al.

(10) Patent No.: US 10,930,445 B2
(45) Date of Patent: Feb. 23, 2021

(54) ROTARY OPERATING DEVICE, METHOD OF CONTROLLING ROTARY OPERATING DEVICE, AND STORAGE MEDIUM

(71) Applicant: ALPS ALPINE CO., LTD., Tokyo (JP)

(72) Inventors: I Ka, Miyagi (JP); Hiroshi Wakuda, Miyagi (JP); Takuya Abe, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 107 days.

(21) Appl. No.: 16/504,506

(22) Filed: Jul. 8, 2019

(65) Prior Publication Data

US 2019/0333720 A1    Oct. 31, 2019

Related U.S. Application Data

(63) Continuation of application No. PCT/JP2018/000476, filed on Jan. 11, 2018.

(30) Foreign Application Priority Data

Jan. 20, 2017 (JP) .............................. JP2017-008778

(51) Int. Cl.
| | |
|---|---|
| *H01H 9/16* | (2006.01) |
| *G05G 5/03* | (2008.04) |
| *G05G 9/047* | (2006.01) |
| *H01H 19/20* | (2006.01) |

(52) U.S. Cl.
CPC ................. *H01H 9/16* (2013.01); *G05G 5/03* (2013.01); *G05G 2009/04751* (2013.01); *H01H 19/20* (2013.01)

(58) Field of Classification Search
CPC ............ H01H 9/16; H01H 19/20; G05G 5/03; G05G 2009/04751

USPC ...................................................... 318/568.1
See application file for complete search history.

(56) References Cited

U.S. PATENT DOCUMENTS

| | | | | |
|---|---|---|---|---|
| 6,144,891 A | * | 11/2000 | Murakami | ............ B23P 19/066 |
| | | | | 700/108 |
| 10,352,379 B2 | * | 7/2019 | Takahashi | .............. H02K 11/21 |
| 2004/0056624 A1 | | 3/2004 | Hayasaka | |
| 2007/0279401 A1 | | 12/2007 | Ramstein et al. | |

(Continued)

FOREIGN PATENT DOCUMENTS

| | | | | |
|---|---|---|---|---|
| JP | 2003-157121 | | 5/2003 | |
| JP | 2004-114201 | | 4/2004 | |
| JP | 2004114201 A | * | 4/2004 | ............. G06F 3/016 |

(Continued)

OTHER PUBLICATIONS

International Search Report dated Apr. 24, 2018 in PCT/JP2018/000476 filed on Jan. 11, 2018.

*Primary Examiner* — Jorge L Carrasquillo
(74) *Attorney, Agent, or Firm* — IPUSA, PLLC (57) ABSTRACT

A rotary operating device includes an operation part that is rotatable according to an operation by an operator, a rotation angle sensor that detects a rotation angle of the operation part, a torque applier that applies application torque to the operation part along a rotation direction of the operation part, a frictional force applier that applies a frictional force to the operation part, and a processor programmed to change the application torque and the frictional force according to the rotation angle.

14 Claims, 7 Drawing Sheets

(56) References Cited

U.S. PATENT DOCUMENTS

2014/0288778 A1* 9/2014 Bean .................. B62D 6/008
  701/41

FOREIGN PATENT DOCUMENTS

| JP | 2009-540399 | 11/2009 |
| JP | 2010-165281 | 7/2010 |
| JP | 2010165281 A * | 7/2010 |
| JP | 2010-211270 | 9/2010 |
| JP | 2011-204021 | 10/2011 |
| JP | 2012-155674 | 8/2012 |
| WO | 2016/208455 | 12/2016 |

* cited by examiner

ROTARY OPERATING DEVICE, METHOD OF CONTROLLING ROTARY OPERATING DEVICE, AND STORAGE MEDIUM

CROSS-REFERENCE TO RELATED APPLICATIONS

The present application is a continuation application filed under 35 U.S.C. 111(a) claiming benefit under 35 U.S.C. 120 and 365(c) of PCT International Application No. PCT/JP2018/000476, filed on Jan. 11, 2018, which is based on and claims priority to Japanese Patent Application No. 2017-008778 filed on Jan. 20, 2017, the entire contents of which are incorporated herein by reference.

BACKGROUND OF THE INVENTION

1. Field of the Invention

An aspect of this disclosure relates to a rotary operating device, a method of controlling the rotary operating device, and a storage medium.

2. Description of the Related Art

There is a known rotary operating device that receives an input such as a transmission gear change in a vehicle or an audio volume change when an operator rotates a rotatable operation part. For example, a force-sensation-applying input device described in Japanese Laid-Open Patent Publication No. 2004-114201 is a rotary operating device including an operation part that is rotatable by an operation of an operator, an actuator that applies torque to the operation part, a rotation angle detector that detects the rotation angle of the operation part, a rotation speed detector that detects the angular velocity of the operation part, and a controller that controls an electric actuator based on the rotation angle and the angular velocity. In the force-sensation-applying input device described in Japanese Laid-Open Patent Publication No. 2004-114201, when the operator rotates the operation part, the controller changes the torque applied by the electric actuator to the operation part at a predetermined angle period to generate an operation feeling indicating an amount of rotation of the operation part as a change in resistance.

However, as a disadvantage of the force-sensation-applying input device of Japanese Laid-Open Patent Publication No. 2004-114201, the operation feeling tends to become monotonous because the operation feeling is changed by only changing the torque. Also with the force-sensation-applying input device, vibration tends to occur at a stabilization point, and it is difficult to generate an operation feeling that clearly indicates the variation in speed.

SUMMARY OF THE INVENTION

In an aspect of this disclosure, there is provided a rotary operating device including an operation part that is rotatable according to an operation by an operator, a rotation angle sensor that detects a rotation angle of the operation part, a torque applier that applies application torque to the operation part along a rotation direction of the operation part, a frictional force applier that applies a frictional force to the operation part, and a processor programmed to change the application torque and the frictional force according to the rotation angle.

DESCRIPTION OF THE PREFERRED EMBODIMENTS

An aspect of this disclosure makes it possible to provide a rotary operating device, a method of controlling the rotary operating device, and a storage medium that can generate various operation feelings.

Embodiments of the present invention are described below with reference the accompanying drawings.

<Overall Configuration>

A rotary operating device according to an embodiment is described below.

Figure 1:
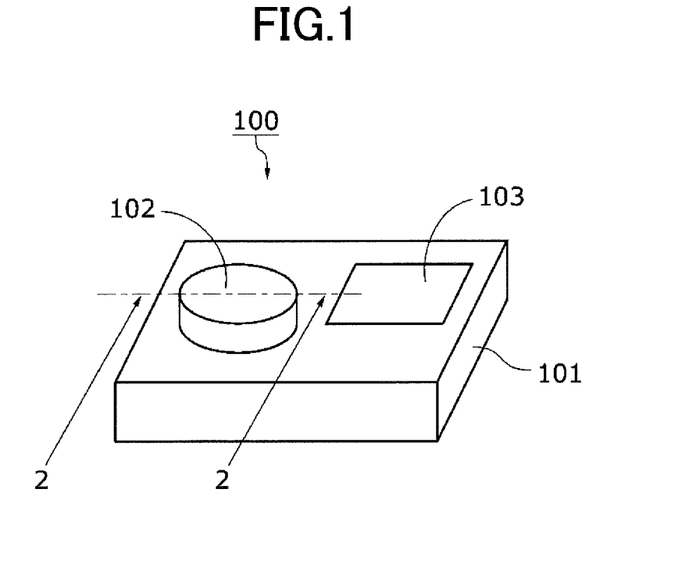
FIG. 1 is a perspective view of a rotary operating device according to an embodiment.

FIG. 1 is a perspective view of a rotary operating device 100 of the present embodiment. The rotary operating device 100 includes a housing 101, an operation part 102 rotatably supported by the housing 101, and a display-input device 103 attached to the housing 101. The operation part 102 is rotatable according to an operation by an operator. The rotary operating device 100 generates an output corresponding to a rotation parameter such as a rotation angle, a rotational position, or a rotation speed of the operation part 102. For example, an audio device (not shown) changes its volume according to the rotational position of the operation part 102. As another example, a controller of a vehicle (not shown) changes transmission gears of the vehicle according to the rotational position of the operation part 102.

The display-input device 103 is a touch panel display that displays various types of information for the operator and receives inputs from the operator. In another example, the display-input device 103 may be configured to present information and receive inputs in response to operations of mechanical parts such as a dial, a slider, and a switch. The display-input device 103 may also be configured to present information and receive inputs through other mechanisms such as an audio input. In the embodiment of FIG. 1, the rotary operating device 100 includes the display-input device 103. However, the display-input device 103 may be omitted.

Figure 2:
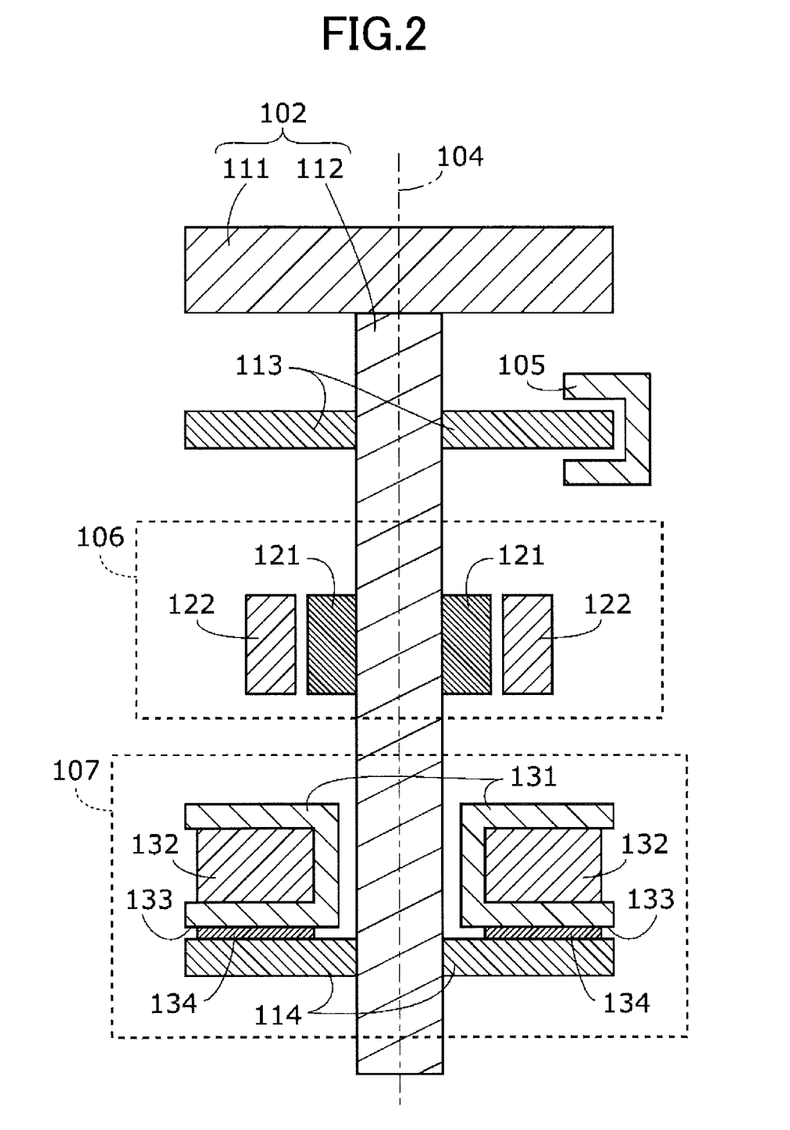
FIG. 2 is a partial cross-sectional view of the rotary operating device taken along line 2-2 in FIG. 1.

FIG. 2 is a partial cross-sectional view of the rotary operating device 100 taken along line 2-2 in FIG. 1. The cross section of FIG. 2 passes through a rotation axis 104 of the operation part 102. As illustrated in FIG. 2, the operation part 102 includes a knob 111 disposed outside of the housing 101 in FIG. 1 and a shaft 112 housed in the housing 101. The knob 111 has a substantially cylindrical outer shape that has a central axis extending along the rotation axis 104. The shaft 112 extends from the knob 111 along the rotation axis 104. The shaft 112 has a substantially cylindrical outer shape that has a central axis extending along the rotation axis 104. The knob 111 and the shaft 112 can rotate together around the rotation axis 104.

The operation part 102 further includes a detection disk 113 that has a disk shape extending in the radial direction from the circumference of the shaft 112, and a resistance disk 114 that has a disk shape and extends in the radial direction from the circumference of the shaft 112. The detection disk 113 and the resistance disk 114 are fixed to the shaft 112 and can rotate around the rotation axis 104 together with the shaft 112.

As illustrated in FIG. 2, the rotary operating device 100 (FIG. 1) further includes, in the housing 101 (FIG. 1), a rotation angle sensor 105 that detects the rotation angle of the operation part 102, a torque applier 106 that applies torque (which may be hereafter referred to as "application torque") to the operation part 102 along the rotation direction of the operation part 102, and a frictional force applier 107 that applies a frictional force to the operation part 102.

<Rotation Angle Sensor>

The rotation angle sensor 105 is a rotary encoder disposed near the outer edge of the detection disk 113. Multiple slits are formed in the periphery of the detection disk 113. The rotation angle sensor 105 optically detects the slits formed in the detection disk 113 to detect the rotation angle of the operation part 102 around the rotation axis 104. As another example, the rotation angle sensor 105 may be configured to detect the rotation angle using another mechanism. For example, the rotation angle sensor 105 may be configured to magnetically detect the movement of a permanent magnet fixed to the shaft 112.

<Torque Applier>

As illustrated in FIG. 2, the torque applier 106 is a stepping motor including multiple rotors 121 that are fixed to the shaft 112 and rotate together with the shaft 112 and multiple stators 122 disposed to face the rotors 121. The rotors 121 are permanent magnets. The stators 122 are coils. When a pulse current is applied to the stators 122, the rotors 121 and the shaft 112 rotate together.

In the present embodiment, the application torque applied to the shaft 112 changes depending on the magnitude of the pulse current applied to the stators 122. The magnitude of the application torque is proportional to the magnitude of the pulse current. The direction of the application torque is determined by the phase of the pulse current applied to the stators 122. As another example, the torque applier 106 may be configured to apply the application torque to the operation part 102 using an electric motor, e.g., a direct-current motor, other than the stepping motor. The torque applier 106 may also be configured to apply the application torque to the operation part 102 using another mechanism.

<Frictional Force Applier>

As illustrated in FIG. 2, the frictional force applier 107 includes a doughnut-shaped coil case 131 disposed around the shaft 112 of the operation part 102 and a magnetic field controller 132 that is implemented by a coil wound around the shaft 112 in the coil case 131 to form a doughnut shape. The coil case 131 has a facing surface 133 extending along a plane that is substantially orthogonal to the rotation axis 104. The facing surface 133 is disposed close to a surface of the resistance disk 114. The frictional force applier 107 further includes a magnetic viscous fluid 134 disposed between the facing surface 133 and the surface of the resistance disk 114. The magnetic viscous fluid 134 is in contact with both of the coil case 131 and the resistance disk 114. The magnetic viscous fluid 134 is prevented from flowing out by a sealing.

The magnetic field passing through the magnetic viscous fluid 134 changes depending on the electric current flowing through the magnetic field controller 132 and as a result, the cohesion of particles constituting the magnetic viscous fluid 134 changes. As the cohesion changes, the frictional force between the magnetic viscous fluid 134 and the resistance disk 114 changes. In the present embodiment, the frictional force applied to the operation part 102 increases as the electric current flowing through the magnetic field controller 132 increases. As another example, the frictional, force applier 107 may be configured to apply the frictional force to the operation part 102 using another mechanism. For example, the frictional force applier 107 may be a brake that mechanically causes a component to contact the operation part 102 and may be an electromagnetic brake.

<Control System>

Figure 3:
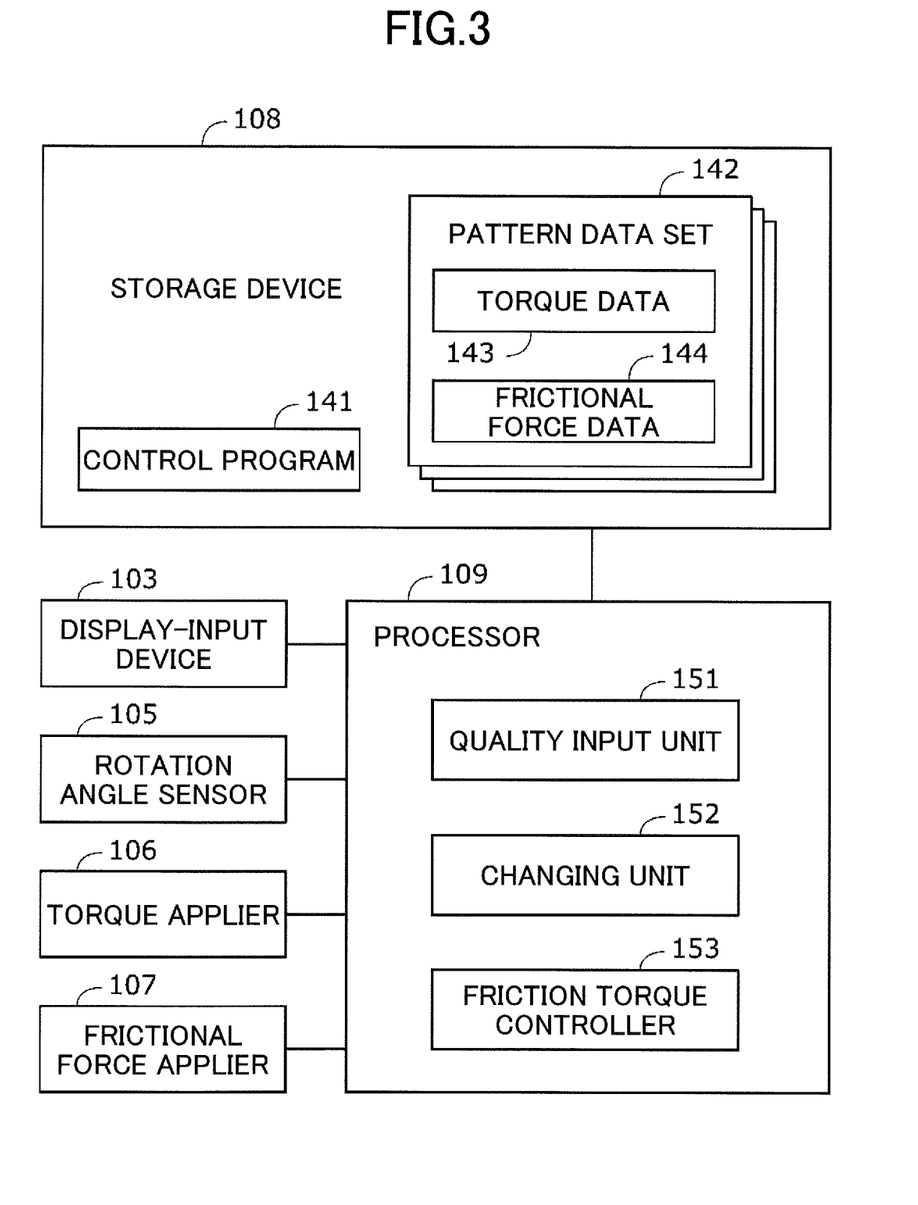
FIG. 3 is a block diagram illustrating a control system of the rotary operating device of FIG. 1.

FIG. 3 is a block diagram illustrating a control system of the rotary operating device 100 of FIG. 1. The rotary operating device 100 further includes a storage device 108 and a processor 109.

<Storage Device>

The storage device 108 stores a control program 141 and multiple pattern data sets 142. The control program 141 is read by the processor 109 and causes the processor 109 to implement a function to perform a part of an operation method and other functions. When the processor 109 executes various functions, the storage device 108 is controlled by the processor 109 and stores information as necessary. The storage device 108 is a non-transitory tangible storage medium. The storage device 108 includes a read-only memory (ROM) and a random access memory (RAM). The storage device 108 is a volatile or nonvolatile storage medium. The storage device 108 may be detachable or not detachable.

Each of the pattern data sets 142 includes torque data 143 and frictional force data 144. The torque data 143 indicates a relationship between the rotation angle of the operation part 102 and a control signal sent to the torque applier 106. As described later, the magnitude of the application torque is proportional to the magnitude of the control signal, and the direction of the application torque is determined based on whether the control signal is positive or negative. Accordingly, the torque data 143 indirectly indicates the relationship between the rotation angle of the operation part 102 and the application torque. The frictional force data 144 indicates a relationship between the rotation angle of the operation part 102 and a frictional force applied to the operation part 102. The frictional force applied to the operation part 102 increases as the electric current flowing through the magnetic field controller 132 of the frictional force applier 107 increases. Therefore, the frictional force data 144 indirectly indicates the frictional force by the magnitude of the electric current (i.e., a current value) applied to the magnetic field controller 132.

<Processor>

The processor 109 reads and executes the control program 141 stored in the storage device 108 and thereby functions as a quality input unit 151, a changing unit 152, and a friction torque controller 153. The processor 109 of the present embodiment is a general-purpose computer. However, the processor 109 may instead be an application specific integrated circuit (ASIC) or any other circuit that can implement functions described in the present embodiment.

The quality input unit 151 displays, on the display-input device 103, a screen for selecting an operation quality preference and receives an input regarding an operation quality preference from an operator. The quality input unit 151 displays buttons for selecting operation quality preferences on the screen and determines an operation quality preference associated with a pressed button. As another example, the quality input unit 151 may be configured to display a dial, a slider, or values to receive an input regarding an operation quality preference. Multiple pattern data sets 142 corresponding to operation quality preferences are stored beforehand in the storage device 108. Details of the pattern data sets 142 are described later.

The changing unit 152 selects, from the storage device 108, a pattern data set 142 corresponding to the operation quality preference input via the quality input unit 151. Through the selection of the pattern data set 142, the changing unit 152 can ultimately change the frictional force applied by the frictional force applier 107 according to the rotation angle and the application torque applied by the torque applier 106 according to the rotation angle.

Based on the torque data 143 in the selected pattern data set 142, the friction torque controller 153 changes the application torque applied by the torque applier 106 according to the rotation angle. Based on the frictional force data 144 in the selected pattern data set 142, the friction torque controller 153 changes the frictional force applied by the frictional force applier 107 according to the rotation angle. According to an instruction from the friction torque controller 153, the stepping motor of the torque applier 106 rotates the operation part 102. According to an instruction from the friction torque controller 153, the frictional force applier 107 changes the electric current flowing through the magnetic field controller 132 and thereby changes the viscosity of the magnetic viscous fluid 134 (FIG. 2).

<Pattern Data Set and Application Torque>

Figure 4:
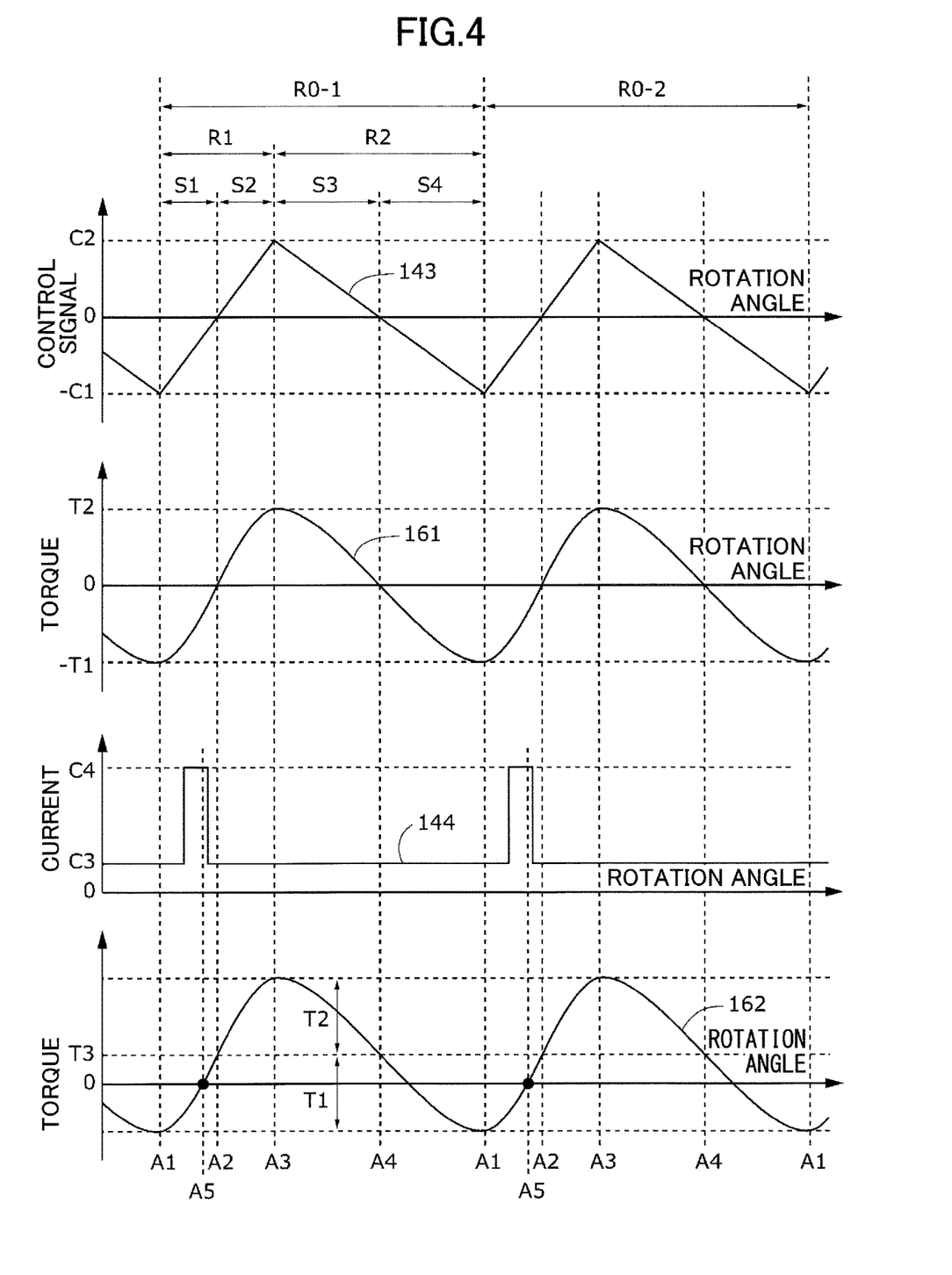
FIG. 4 is a graph indicating examples of torque data, application torque, frictional force data, and total torque.

FIG. 4 is a graph indicating the torque data 143 and the frictional force data 144 in an example of a pattern data set 142 (FIG. 3). FIG. 4 also indicates application torque 161 applied to the operation part 102 based on the torque data 143 and total torque 162 obtained by adding together a frictional force applied to the operation part 102 based on the frictional force data 144 and the application torque 161. The pattern data set 142 (FIG. 3) of the present embodiment is applied based on an assumption that the rotation direction of the operation part 102 (FIG. 2) is the positive direction. When the operation part 102 rotates in the reverse direction, the pattern data set 142 (FIG. 3) is applied based on an assumption that the new rotation direction is the positive direction.

The torque data 143 in FIG. 4 indicates a relationship between a 360-degree rotation angle and a control signal sent to the torque applier 106. In FIG. 4, a part of the 360-degree rotation angle is illustrated in an enlarged form.

The magnitude of the control signal in the torque data 143 indicates the magnitude of a pulse current applied to the stators 122 (FIG. 2). When the control signal is positive, the application torque 161 becomes positive, and application torque is applied to the operation part 102 (FIG. 2) in the negative direction (i.e., in a direction opposite the rotation direction). As a result, the operator feels resistance. When the control signal is negative, the application torque 161 becomes negative, and application torque is applied to the operation part 102 (FIG. 2) in the positive direction (i.e., in the rotation direction). As a result, the operator feels propulsion.

The 360-degree rotation angle is divided equally into twelve consecutive angle ranges R0 (R0-1 through R0-12). In FIG. 4, a first angle range R0-1 and a second angle range R0-2 included in the twelve angle ranges R0 are illustrated in an enlarged form. One angle range R0 corresponds to a rotation angle of 30 degrees. Each angle range R0 includes a first section R1 and a second section R2 that are arranged consecutively. The second section R2 follows the first section R1. The first section R1 includes a first subsection S1 and a second subsection S2. The second section R2 includes a third subsection S3 and a fourth subsection S4. The angle range R0 starts with the first subsection S1, and the second subsection S2, the third subsection S3, and the fourth subsection S4 follow the first subsection S1 in this order in the positive direction.

In the first subsection S1 from a rotation angle A1 to a rotation angle A2, the sign of the control signal is negative, and the magnitude (i.e., absolute value) of the control signal decreases substantially linearly from C1 to zero as the rotation angle changes in the positive direction. Similarly, in the first subsection S1, the sign of the application torque 161 is negative (i.e., the application torque 161 is in the rotation direction), and the absolute value of the application torque 161 gradually decreases from a first magnitude T1 to zero.

In the second subsection S2 from the rotation angle A2 to a rotation angle A3, the sign of the control signal is positive, and the magnitude of the control signal increases substantially linearly from zero to C2 as the rotation angle changes in the positive direction. The slope of the control signal in the second subsection S2 is substantially the same as the slope of the control signal in the first subsection S1. Similarly, in the second subsection S2, the sign of the application torque 161 is positive (i.e., the application torque 161 is in a direction opposite the rotation direction), and the absolute value of the application torque 161 gradually increases from zero to a second magnitude T2.

In the third subsection S3 from the rotation angle A3 to a rotation angle A4, the sign of the control signal is positive, and the magnitude of the control signal decreases substantially linearly from C2 to zero as the rotation angle changes in the positive direction. Similarly, in the third subsection S3, the sign of the application torque 161 is positive (i.e., the application torque 161 is in a direction opposite the rotation direction), and the absolute value of the application torque 161 gradually decreases from the second magnitude T2 to zero.

In the fourth subsection S4 from the rotation angle A4 to the initial rotation angle A1 in the next angle range R0, the sign of the control signal is negative, and the magnitude (i.e., absolute value) of the control signal increases substantially linearly from zero to C1 as the rotation angle changes in the positive direction. The slope of the control signal in the fourth subsection S4 is substantially the same as the slope of the control signal in the third subsection S3. Similarly, in the fourth subsection S4, the sign of the application torque 161 is negative (i.e., the application torque 161 is in the rotation direction), and the absolute value of the application torque 161 gradually increases from zero to the first magnitude T1.

The application torque 161 gently changes like a sine wave near the rotation angle A1 and near the rotation angle A3.

The frictional force data 144 in FIG. 4 indicates changes in the magnitude of the electric current (i.e., a current value) applied to the frictional force applier 107 in relation to the 360-degree rotation angle. In FIG. 4, only a part of the 360-degree rotation angle is illustrated in an enlarged form. As indicated by the frictional force data 144, an electric current with a substantially constant current value C3 is applied throughout the angle range R0. As a result, the total torque 162 becomes greater than the application torque 161 by an amount corresponding to a steady frictional force T3.

The steady frictional force T3 is less than the first magnitude T1. That is, the total torque 162 necessarily becomes zero at a given rotation angle.

As indicated by the frictional force data 144, in a period in the first subsection S1 including a rotation angle A5 at which the total torque 162 becomes zero, a pulse current with a current value C4 greater than the current value C3 is also applied. As a result, near the rotation angle A5, a frictional force greater than the steady frictional force T3 is applied. However, the frictional force greater than the steady frictional force T3 is not reflected in the total torque 162 in FIG. 4.

Overall, the total torque 162 directed toward the rotation angle A5 that is a stabilization point is applied to the operation part 102. When the operation part 102 is rotated in the positive direction from the rotation angle A5 to the rotation angle A3, the magnitude of the total torque 162 applied to the operation part 102 in the negative direction gradually increases. As a result, the operator feels the resistance that gradually increases. When the operation part 102 exceeds the rotation angle A3, the magnitude of the total torque 162 applied to the operation part 102 in the negative direction gradually decreases. Therefore, using the momentum gained when rotating the operation part 102 past the rotation angle A3, the operator can further rotate the operation part 102 in the positive direction without much feeling the resistance. After a while after the operation part 102 exceeds the rotation angle A4, the total torque 162 reaches zero. Then, the total torque 162 is applied to the operation part 102 in the positive direction, and the operator feels as if the operation part 102 is propelled toward the rotation angle A5 in the next angle range R0. Near the rotation angle A5, the frictional force greater than the steady frictional force T3 is applied to the operation part 102. Therefore, the operator can stop the operation part 102 at the rotation angle A5 without greatly vibrating the operation part 102.

<Different Types of Torque Data>

Figure 5:
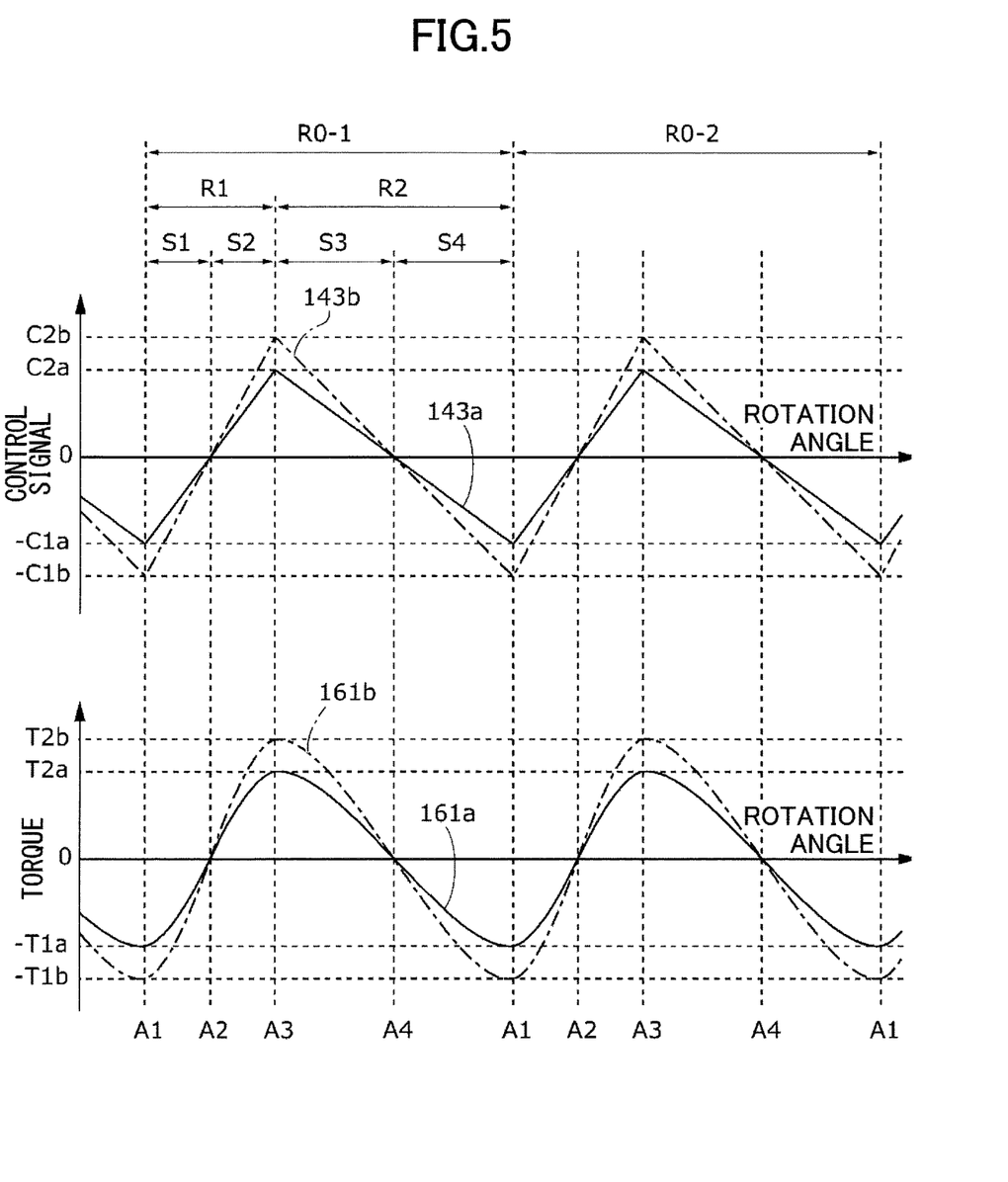
FIG. 5 is a graph indicating examples of torque data and application torque for respective operation quality preferences.

FIG. 5 is a graph indicating examples of the torque data 143 and the application torque 161 for respective operation quality preferences. First torque data 143a is torque data 143 included in a pattern data set 142 (FIG. 3) corresponding to a difficult-to-feel operation feeling. Second torque data 143b is torque data 143 included in a pattern data set 142 (FIG. 3) corresponding to an easy-to-feel operation feeling. First application torque 161a indicates torque applied to the operation part 102 based on the first torque data 143a. Second application torque 161b indicates torque applied to the operation part 102 based on the second torque data 143b.

Each of the waveform of the control signal of the first torque data 143a and the waveform of the control signal of the second torque data 143b in FIG. 5 is obtained by expanding or contracting the torque data 143 in FIG. 4 in the vertical axis direction. Both of the control signal of the first torque data 143a and the control signal of the second torque data 143b become zero at the rotation angle A2 and the rotation angle A4. The control signal of the first torque data 143a becomes −C1a at the rotation angle A1 and becomes C2a at the rotation angle A3. The control signal of the second torque data 143b becomes −C1b at the rotation angle A1 and becomes C2b at the rotation angle A3.

The first magnitude C1a in the first torque data 143a is less than the first magnitude C1b in the control signal of the second torque data 143b. The second magnitude C2a in the first torque data 143a is less than the second magnitude C2b in the control signal of the second torque data 143b.

Each of the waveform of the first application torque 161a and the waveform of the second application torque 161b in FIG. 5 is obtained by expanding or contracting the application torque 161 in FIG. 4 in the vertical axis direction. Both of the first application torque 161a and the second application torque 161b become zero at the rotation angle A2 and the rotation angle A4. The first application torque 161a becomes −T1a at the rotation angle A1 and becomes T2a at the rotation angle A3. The second application torque 161b becomes −T1b at the rotation angle A1 and becomes T2b at the rotation angle A3.

The first magnitude T1a in the first application torque 161a is less than the first magnitude T1b in the second application torque 161b. The second magnitude T2a in the first application torque 161a is less than the second magnitude T2b in the second application torque 161b. That is, the sum of the first magnitude T1a and the second magnitude T2a in the pattern data set 142 corresponding to the difficult-to-feel click operation feeling is less than the sum of the first magnitude T1b and the second magnitude T2b in the pattern data set 142 corresponding to the easy-to-feel click operation feeling. This is based on an experiment result indicating that the operator can more easily feel the click operation feeling as the sum of the first magnitude T1 (FIG. 4) and the second magnitude T2 (FIG. 4) increases. Also, another experiment result indicates that it becomes more difficult to feel the click operation feeling as the steady frictional force T3 (FIG. 4) increases. Therefore, the operation feeling can be made heavier without changing the click operation feeling by increasing the steady frictional force T3 and the sum of the first magnitude T1 and the second magnitude T2 at the same time.

<Other Types of Torque Data>

Figure 6:
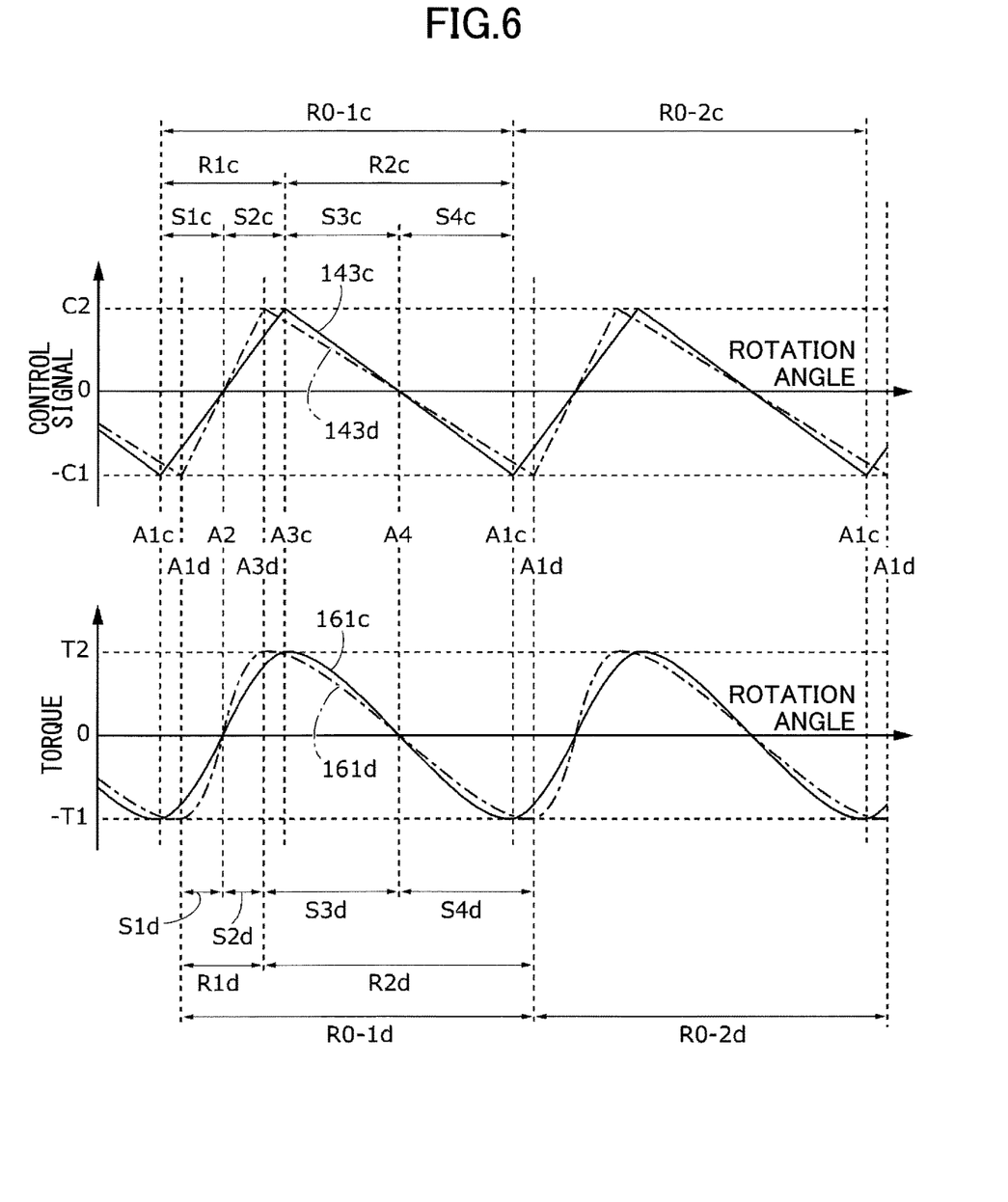
FIG. 6 is a graph indicating other examples of torque data and application torque for respective operation quality preferences.

FIG. 6 is a graph indicating other examples of the torque data 143 and the application torque 161 for respective operation quality preferences. Third torque data 143c is torque data 143 included in a pattern data set 142 (FIG. 3) corresponding to a soft operation feeling. Fourth torque data 143d is torque data 143 included in a pattern data set 142 (FIG. 3) corresponding to a sharp operation feeling. Third application torque 161c indicates torque applied to the operation part 102 based on the third torque data 143c. Fourth application torque 161d indicates torque applied to the operation part 102 based on the fourth torque data 143d.

Each of the waveform of the control signal of the third torque data 143c and the waveform of the control signal of the fourth torque data 143d in FIG. 6 is the same as the waveform of the control signal of the torque data 143 in FIG. 4. Each of the third application torque 161c and the fourth application torque 161d in FIG. 6 is the same as the application torque 161 in FIG. 4. Information items having the same name but having different symbols in FIGS. 4 and 6 correspond to each other. Symbols having an affix "c" indicate information items related to the third torque data 143c and the third application torque 161c. Symbols having an affix "d" indicate information items related to the fourth torque data 143d and the fourth application torque 161d.

As illustrated in FIG. 6, both of the control signal of the third torque data 143c and the control signal of the fourth torque data 143d become zero at the rotation angle A2 and the rotation angle A4. That is, the stabilization point is constant. A first subsection S1d in the fourth torque data 143d is shorter than a first subsection S1c in the third torque data 143c. A second subsection S2d in the fourth torque data 143d is shorter than a second subsection S2c in the third torque data 143c. A third subsection S3d in the fourth torque data 143d is longer than a third subsection S3c in the third torque data 143c. A fourth subsection S4d in the fourth torque data 143d is longer than a fourth subsection S4c in the third torque data 143c.

The slope of the control signal of the fourth torque data 143d in a first section R1d is greater than the slope of the control signal of the third torque data 143c in a first section R1c. The slope of the control signal of the fourth torque data 143d in a second section R2d is less than the slope of the control signal of the third torque data 143c in a second section R2c. Accordingly, the change of the fourth application torque 161d in the first section R1d is faster than the change of the third application torque 161c in the first section R1c. The change of the fourth application torque 161d in the second section R2d is slower than the change of the third application torque 161c in the second section R2c.

That is, the ratio of the first section R1d to the second section R2d in the fourth torque data 143d in the pattern data set 142 (FIG. 3) corresponding to the sharp operation feeling is less than the ratio of the first section R1c to the second section R2c in the third torque data 143c in the pattern data set 142 (FIG. 3) corresponding to the soft operation feeling. This is based on an experiment result indicating that the operator feels a sharper operation feeling as the ratio of the first section R1 to the second section R2 (FIG. 4) becomes smaller. Also, an experiment result indicates that the operator feels lightness when both a light operation feeling (small steady frictional force T3 (FIG. 4)) and a sharp operation feeling are achieved. Further, in another experiment, it has been found that when the operation feeling is heavy (the steady frictional force T3 (FIG. 4) is large), the operator can feel a massive feeling but cannot clearly feel a click operation feeling. To obtain a sharp operation feeling in this case, it is preferable to increase the sum of the first magnitude T1 and the second magnitude T2 while maintaining the ratio of the first section R1 to the second section R2.

<Control Method>

Figure 7:
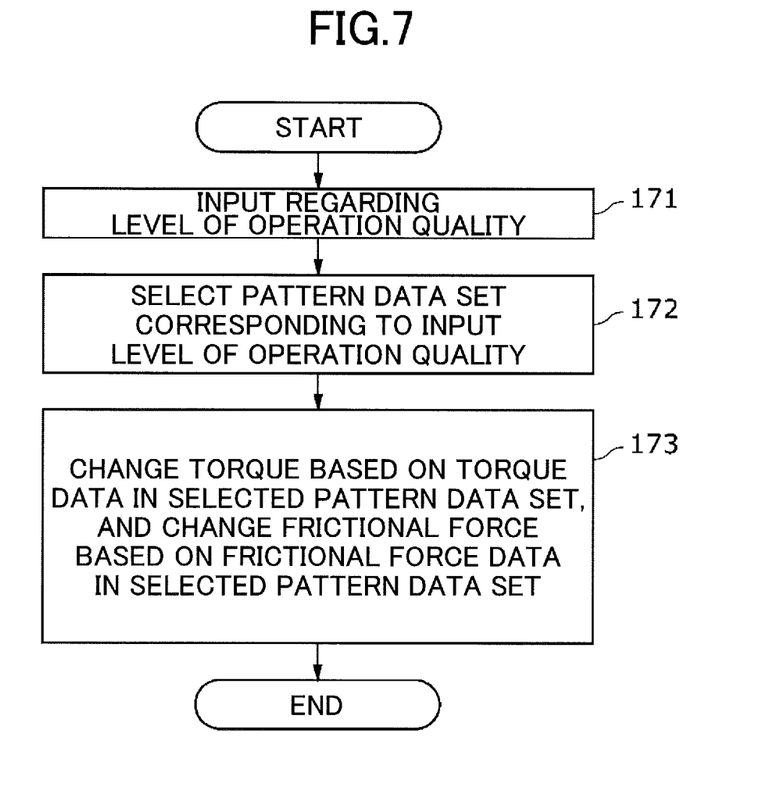
FIG. 7 is a flowchart illustrating a method for controlling the rotary operating device of FIG. 1.

FIG. 7 is a flowchart illustrating a method for controlling the rotary operating device 100 of FIG. 1. A method of controlling the rotary operating device 100 is described below.

At step 171, the quality input unit 151 displays, on the display-input device 103, a screen for selecting an operation quality preference and receives an input regarding an operation quality preference from the operator. The quality input unit 151 displays buttons for selecting operation quality preferences on the screen and determines an operation quality preference associated with a pressed button.

After step 171, at step 172, the changing unit 152 selects, from the storage device 108, a pattern data set 142 corresponding to the operation quality preference input via the quality input unit 151.

After step 172, at step 173, based on the torque data 143 in the selected pattern data set 142, the friction torque controller 153 changes the application torque applied by the torque applier 106 to the operation part 102 according to a rotation angle detected by the rotation angle sensor 105. For example, the friction torque controller 153 generates the control signal of the torque data 143 as illustrated in FIG. 4 to control the torque applier 106. The torque applier 106 applies application torque in a direction opposite the rotation direction of the operation part 102 when the control signal is positive, and applies application torque in the same direction as the rotation direction of the operation part 102 when the control signal is negative. The torque applier 106 applies application torque that is proportional to the magnitude of the control signal.

Also at step 173, based on the frictional force data 144 in the selected pattern data set 142, the friction torque controller 153 changes the frictional force applied by the frictional force applier 107 to the operation part 102 according to a rotation angle detected by the rotation angle sensor 105. For example, the friction torque controller 153 sends a current value obtained based on the frictional force data 144 as illustrated in FIG. 4 to the frictional force applier 107. The frictional force applier 107 applies an electric current corresponding to the current value received from the friction torque controller 153 to the magnetic field controller 132 and thereby changes the viscosity of the magnetic viscous fluid 134 (FIG. 2). The frictional force applied to the operation part 102 changes according to the electric current applied to the magnetic field controller 132. Step 173 is repeated as necessary.

The torque data 143 of the present embodiment illustrated in FIG. 4 represents changes in the application torque in all angle ranges R0. However, as another example, the torque data 143 may indicate changes in the application torque in one or more angle ranges R0 whose total is less than 360 degrees. The frictional force data 144 of the present embodiment represents changes in the frictional force in all angle ranges R0. However, the frictional force data 144 may indicate changes in the frictional force in one or more angle ranges R0 whose total is less than 360 degrees.

As an example, the changing unit 152 (FIG. 3) changes the ratio of the first section R1 to the second section R2 in FIG. 4. As an example, the changing unit 152 (FIG. 3) changes the sum of the first magnitude T1 and the second magnitude T2 in FIG. 4. As an example, the changing unit 152 (FIG. 3) changes the steady frictional force T3. As an example, the changing unit 152 (FIG. 3) changes the number of angle ranges R0 in 360 degrees. As an example, the changing unit 152 (FIG. 3) changes the length of each angle range R0. That is, the angle range R0 is not necessarily 30 degrees and may be wider or narrower than 30 degrees.

In another example, the changing unit 152 illustrated in FIG. 3 may change the pattern data set 142 based on information other than the input from the quality input unit 151. For example, the changing unit 152 may be configured to display, on the display-input device 103, a screen for directly selecting a pattern data set 142 and receive a selection. The changing unit 152 may change the pattern data set 142 in terms of time. The changing unit 152 may change a part or the entirety of the pattern data set 142 based on a user input.

As an example, the changing unit 152 (FIG. 3) may be configured to directly change at least one of the application torque and the frictional force without using the pattern data set 142. As an example, the changing unit 152 (FIG. 3) may be configured to change at least one of the application torque and the frictional force based on a mathematical formula.

<Summary>

According to the present embodiment, the friction torque controller 153 changes the application torque 161 applied by the torque applier 106 to the operation part 102 and the frictional force applied by the frictional force applier 107 to the operation part 102 according to the rotation angle of the operation part 102. Compared with the related-art technology, the present embodiment makes it possible to give various operation feelings to an operator.

According to the present embodiment, the rotary operating device 100 further includes the changing unit 152 that changes at least one of the relationship between the application torque 161 and the rotation angle and the relationship between the frictional force and the rotation angle. Thus, the present embodiment makes it possible to give the operator an appropriate operation feeling that is selected from various operation feelings according to the preference of the operator.

According to the present embodiment, in addition to changing the application torque 161 based on the torque data 143 in the selected pattern data set 142, the friction torque controller 153 changes the frictional force based on the frictional force data 144 in the selected pattern data set 142. Compared with a case where only one of the torque data 143 and the frictional force data 144 is used, the present embodiment makes it possible to give various operation feelings to the operator.

The present embodiment makes it possible to generate distinct resistance based on the torque data 143 when the operation part 102 exceeds the rotation angle corresponding to the second magnitude T2 and to generate steady weight by the steady frictional force based on the frictional force data 144. Thus, the present embodiment can give the operator various operation feelings based on a combination of the torque data 143 and the frictional force data 144.

According to the present embodiment, a frictional force greater than the steady frictional force T3 is applied at a rotation angle in the first subsection S1 of the angle range R0 at which the sum of the application torque 161 and the steady frictional force T3 becomes zero. This configuration makes it possible to prevent vibration of the operation part 102 at a stabilization point at which the sum of the application torque 161 and the steady frictional force T3 becomes zero, and to give a comfortable operation feeling to the operator.

According to the present embodiment, the changing unit 152 can change the ratio of the first section R1 to the second section R2 to give various operation feelings to the operator. For example, reducing the ratio of the first section R1 to the second section R2 can make the change in resistance faster and give the operator a sharp operation feeling. On the other hand, increasing the ratio of the first section R1 to the second section R2 can make the change in resistance smoother and give the operator a less-sharp operation feeling.

According to the present embodiment, the changing unit 152 can change the sum of the first magnitude T1 and the second magnitude T2 to give various operation feelings to the operator. For example, when the sum of the first magnitude T1 and the second magnitude T2 is large, the operator needs to apply a large force to rotate the operation part 102 beyond the first section R1. Accordingly, an easy-to-feel click operation feeling is generated. On the other hand, when the sum of the first magnitude T1 and the second magnitude T2 is small, the operator needs to apply only a small force to rotate the operation part 102 beyond the first section R1. Accordingly, a difficult-to-feel click operation feeling is generated.

According to the present embodiment, the changing unit 152 can change the steady frictional force T3 to give various operation feelings to the operator. As the steady frictional force T3 increases, it becomes more difficult to rotate the operation part 102 and a heavy operation feeling is generated. On the other hand, as the steady frictional force T3 decreases, it becomes easier to rotate the operation part 102 and a light operation feeling is generated.

According to the present embodiment, the changing unit 152 selects, from the storage device 108, a pattern data set 142 corresponding to the operation quality preference input via the quality input unit 151. This configuration makes it possible to generate an operation feeling corresponding to a preference of the operator.

According to the present embodiment, the ratio of the first section R1 to the second section R2 in the pattern data set 142 corresponding to a sharp operation feeling is less than the ratio of the first section R1 to the second section R2 in the pattern data set 142 corresponding to a soft operation feeling. Accordingly, decreasing the ratio of the first section R1 to the second section R2 makes it possible to cause the operator to feel a sharper operation feeling.

According to the present embodiment, the sum of the first magnitude T1 and the second magnitude T2 in the pattern data set 142 corresponding to the easy-to-feel click operation feeling is greater than the sum of the first magnitude T1 and the second magnitude T2 in the pattern data set 142 corresponding to the difficult-to-feel click operation feeling. Accordingly, selecting the easy-to-feel click operation feeling makes it possible to cause the operator to feel the easy-to-feel operation feeling.

According to the present embodiment, the torque applier 106 includes a stepping motor that is an electric motor that rotates the operation part 102 according to an instruction from the friction torque controller 153. Thus, the rotary operating device 100 can electrically control the application torque 161.

According to the present embodiment, the resistance applied to the operation part 102 is changed by changing the viscosity of the magnetic viscous fluid 134. Compared with a configuration where a solid object is brought into contact with the operation part 102 to apply a friction brake force, the configuration of the present embodiment makes it possible to provide various types of fine operation feelings.

The present invention is not limited to the embodiment described above. A person skilled in the art may change, combine, partially combine, and replace the components described in the above embodiment without departing from the technical scope and the range of equivalence of the present invention.

The present invention is applicable to various types of rotary operating devices that generate outputs according to the rotation of an operation part. For example, the present invention may be applicable to a rotary operating device that changes transmission gears of a vehicle or changes the volume of an audio device.

What is claimed is:

1. A rotary operating device, comprising:
   an operation part that is rotatable according to an operation by an operator;
   a rotation angle sensor that detects a rotation angle of the operation part;
   a torque applier that applies application torque to the operation part along a rotation direction of the operation part;
   a frictional force applier that applies a frictional force to the operation part;
   a processor programmed to change the application torque and the frictional force according to the rotation angle; and
   a storage device that stores multiple pattern data sets each of which includes a combination of torque data and frictional force data, wherein
   the torque data in each pattern data set of the multiple pattern data sets indicates changes in the application torque in one or more angle ranges of the rotation angle;
   each of the angle ranges includes a first section and a second section that are arranged consecutively;
   the first section includes a first subsection where the application torque in a first direction decreases from a first magnitude to zero along with a change in the rotation angle in the first direction and a second subsection where the application torque in a second direction opposite the first direction increases from zero to a second magnitude along with a change in the rotation angle in the first direction;

the second section includes a third subsection where the application torque in the second direction decreases from the second magnitude to zero along with a change in the rotation angle in the first direction and a fourth subsection where the application torque increases from zero to the first magnitude along with a change in the rotation angle in the first direction;

the frictional force data in the pattern data set indicates changes in the frictional force in the angle ranges; and the frictional force data indicates that a substantially-constant steady frictional force less than the first magnitude is applied to the operation part throughout the angle ranges.

2. The rotary operating device as claimed in claim 1, wherein the processor is programmed to change at least one of a relationship between the application torque and the rotation angle and a relationship between the frictional force and the rotation angle.

3. The rotary operating device as claimed in claim 1, wherein the processor is programmed to
select a pattern data set from the pattern data sets stored in the storage device,
change the application torque based on the torque data in the selected pattern data set, and
change the frictional force based on the frictional force data in the selected pattern data set.

4. The rotary operating device as claimed in claim 3, wherein the storage device stores the pattern data sets corresponding to operation quality preferences;
the processor is programmed to
receive an operation quality preference from the operator, and
select the pattern data set corresponding to the received operation quality preference from the pattern data sets stored in the storage device.

5. The rotary operating device as claimed in claim 3, wherein the storage device stores the pattern data sets corresponding to operation quality preferences;
the processor is programmed to
receive an operation quality preference from the operator, and
select the pattern data set corresponding to the received operation quality preference from the pattern data sets stored in the storage device;
the operation quality preferences include a sharp operation feeling and a soft operation feeling; and
a ratio of the first section to the second section in one of the pattern data sets corresponding to the sharp operation feeling is less than a ratio of the first section to the second section in one of the pattern data sets corresponding to the soft operation feeling.

6. The rotary operating device as claimed in claim 3, wherein the storage device stores the pattern data sets corresponding to operation quality preferences;
the processor is programmed to
receive an operation quality preference from the operator, and
select the pattern data set corresponding to the received operation quality preference from the pattern data sets stored in the storage device;
the operation quality preferences include an easy-to-feel operation feeling and a difficult-to-feel operation feeling; and
a sum of the first magnitude and the second magnitude in one of the pattern data sets corresponding to the easy-to-feel operation feeling is greater than a sum of the first magnitude and the second magnitude in one of the pattern data sets corresponding to the difficult-to-feel operation feeling.

7. The rotary operating device as claimed in claim 1, wherein the frictional force data in the pattern data set further indicates that a frictional force greater than the steady frictional force is applied to the operation part at a rotation angle in the first subsection of the angle range at which a sum of the application torque and the steady frictional force becomes zero.

8. The rotary operating device as claimed in claim 1, wherein the processor is programmed to change a ratio of the first section to the second section.

9. The rotary operating device as claimed in claim 1, wherein the processor is programmed to change a sum of the first magnitude and the second magnitude.

10. The rotary operating device as claimed in claim 1, wherein the processor is programmed to change a magnitude of the steady frictional force.

11. The rotary operating device as claimed in claim 1, wherein the torque applier includes an electric motor that rotates the operation part according to an instruction from the processor.

12. The rotary operating device as claimed in claim 1, wherein the frictional force applier includes a magnetic viscous fluid contacting the operation part and a magnetic field controller that changes viscosity of the magnetic viscous fluid according to an instruction from the processor.

13. A method performed by a processor of a rotary operating device including an operation part that is rotatable according to an operation by an operator, the method comprising:

causing a rotation angle sensor of the rotary operating device to detect a rotation angle of the operation part;
causing a torque applier of the rotary operating device to apply application torque to the operation part along a rotation direction of the operation part;
causing a frictional force applier of the rotary operating device to apply a frictional force to the operation part;
changing the application torque and the frictional force according to the rotation angle; and
changing at least one of a relationship between the application torque and the rotation angle and a relationship between the frictional force and the rotation angle, wherein
multiple pattern data sets are stored in a storage device, each of the pattern data sets including a combination of torque data and frictional force data, the torque data indicating the relationship between the application torque and the rotation angle, and the frictional force data indicating the relationship between the frictional force and the rotation angle;
the torque data in each pattern data set of the multiple pattern data sets indicates changes in the application torque in one or more angle ranges of the rotation angle,
each of the angle ranges includes a first section and a second section that are arranged consecutively, the first section includes a first subsection where the application torque in a first direction decreases from a first magnitude to zero along with a change in the rotation angle in the first direction and a second subsection where the application torque in a second direction opposite the first direction increases from zero to a second magnitude along with a change in the rotation angle in the first direction, the second section includes a third subsection where the application torque in the second direction decreases from the second magnitude to zero along with a change in the rotation angle in the first direction and a fourth subsection where the application torque increases from zero to the first magnitude along with a change in the rotation angle in the first direction, the frictional force data in the pattern data set indicates changes in the frictional force in the angle ranges, and the frictional force data indicates that a substantially-constant steady frictional force less than the first magnitude is applied to the operation part throughout the angle ranges; and the method further comprises
selecting a pattern data set from the pattern data sets stored in the storage device,
changing the application torque based on the torque data in the selected pattern data set, and
changing the frictional force based on the frictional force data in the selected pattern data set.

14. A non-transitory computer-readable storage medium storing a control program that causes a computer to execute a process for controlling a rotary operating device including an operation part that is rotatable according to an operation by an operator, the process comprising:

causing a rotation angle sensor of the rotary operating device to detect a rotation angle of the operation part;

causing a torque applier of the rotary operating device to apply application torque to the operation part along a rotation direction of the operation part;

causing a frictional force applier of the rotary operating device to apply a frictional force to the operation part;

changing the application torque and the frictional force according to the rotation angle; and changing at least one of a relationship between the application torque and the rotation angle and a relationship between the frictional force and the rotation angle, wherein multiple pattern data sets are stored in a storage device, each of the pattern data sets including a combination of torque data and frictional force data, the torque data indicating the relationship between the application torque and the rotation angle, and the frictional force data indicating the relationship between the frictional force and the rotation angle;

the torque data in each pattern data set of the multiple pattern data sets indicates changes in the application torque in one or more angle ranges of the rotation angle, each of the angle ranges includes a first section and a second section that are arranged consecutively, the first section includes a first subsection where the application torque in a first direction decreases from a first magnitude to zero along with a change in the rotation angle in the first direction and a second subsection where the application torque in a second direction opposite the first direction increases from zero to a second magnitude along with a change in the rotation angle in the first direction, the second section includes a third subsection where the application torque in the second direction decreases from the second magnitude to zero along with a change in the rotation angle in the first direction and a fourth subsection where the application torque increases from zero to the first magnitude along with a change in the rotation angle in the first direction, the frictional force data in the pattern data set indicates changes in the frictional force in the angle ranges, and the frictional force data indicates that a substantially-constant steady frictional force less than the first magnitude is applied to the operation part throughout the angle ranges; and the process further comprises
selecting a pattern data set from the pattern data sets stored in the storage device,
changing the application torque based on the torque data in the selected pattern data set, and
changing the frictional force based on the frictional force data in the selected pattern data set.

* * * * *